(12) United States Patent
Yoshida (10) Patent No.: US 6,337,252 B1
(45) Date of Patent: Jan. 8, 2002

(54) SEMICONDUCTOR DEVICE MANUFACTURING METHOD

(75) Inventor: Hiroshi Yoshida, Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 09/315,826

(22) Filed: May 21, 1999

(30) Foreign Application Priority Data

May 26, 1998 (JP) ............................................ 10-144316

(51) Int. Cl.⁷ .............................................. H01L 21/331
(52) U.S. Cl. ........................ 438/359; 438/377; 438/376
(58) Field of Search ................................. 438/309, 356, 438/357, 358, 372, 369, 370, 377, 376

(56) References Cited

U.S. PATENT DOCUMENTS

| | | | | |
|---|---|---|---|---|
| 5,837,590 A | * | 11/1998 | Latham et al. | 438/364 |
| 6,001,700 A | * | 12/1999 | Peidous | 438/309 |
| 6,001,701 A | * | 12/1999 | Carroll et al. | |

FOREIGN PATENT DOCUMENTS

| | | |
|---|---|---|
| JP | S64-39063 | 2/1989 |
| JP | H3-116774 | 5/1991 |
| JP | 3-194935 | 8/1991 |
| JP | H5-335364 | 12/1993 |
| JP | 9-27551 | 1/1997 |
| JP | H10-70194 | 3/1998 |

* cited by examiner

*Primary Examiner*—Tuan H. Nguyen
(74) *Attorney, Agent, or Firm*—Sughrue Mion, PLLC (57) ABSTRACT

There is provided a method of manufacturing a semiconductor device which can use commonly a part of a step of forming a PAP transistor with a step of forming an NON transistor. In an area separated by a side separation region (5) of PNP formed by doping N-type impurities simultaneously with the formation of the collector region (4) of NPN, an N-type bottom separation region (8) of PNP, a collector region (9) and a base region (10) are formed by using the same mask. Trenches (18, 17) extending to the collector regions (9, 4) are formed by an over-etching treatment carried out when the emitter electrodes (16, 15) of PNP and NPN are subjected to a patterning treatment, and N-type impurities are doped through the trench (17) simultaneously with the formation of an external base region (20) of PNP, thereby forming a collector drawing region (21) of NPN. Further, P-type impurities are doped through the trench (18) simultaneously with the formation of an external base region (19) of NPN, thereby forming a collector drawing region (22) of PNP.

10 Claims, 9 Drawing Sheets

SEMICONDUCTOR DEVICE MANUFACTURING METHOD

BACKGROUND OF THE INVENTION

1. Field of the Invention

The present invention relates to a technical field of semiconductor devices, and particularly to a method of manufacturing a semiconductor device in which a vertical (vertical type) PNP bipolar transistor (hereinafter referred to as "V-PNP") or a vertical (vertical type) NPN bipolar transistor (hereinafter referred to as "V-NPN") is formed on a semiconductor substrate.

2. Description of the Related Art

There have been hitherto utilized various methods of manufacturing semiconductor devices having V-PNP disclosed in Japanese Patent Application Laid-open No. Hei-9-223746, Japanese Patent Application Laid-open No. Hei-9-307011, etc.

Figure 16:
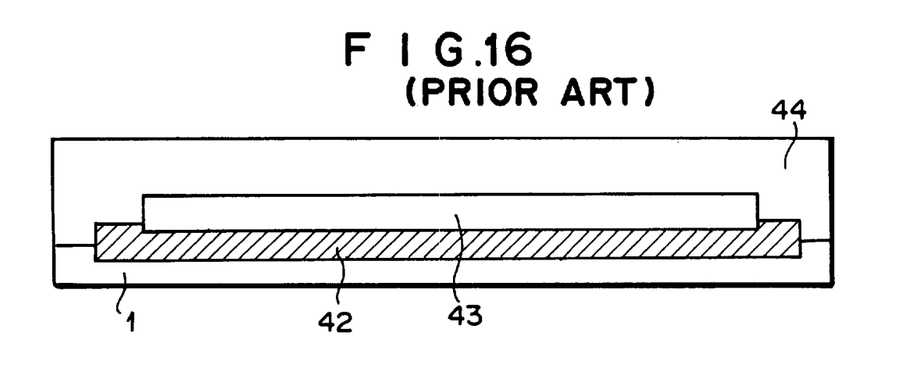
FIG. 16 is a cross-sectional view showing a first conventional semiconductor device manufacturing process.

According to a first conventional method, a high-concentration N-type impurities region 42 is formed in a partial area of a P-type silicon substrate 1, and then a high-concentration P-type impurities region 43 is formed on the high-concentration N-type impurities region 42 as shown in FIG. 16. Thereafter, an epitaxial layer 44 containing N-type impurities is grown on the overall surface of the substrate.

Figure 17:
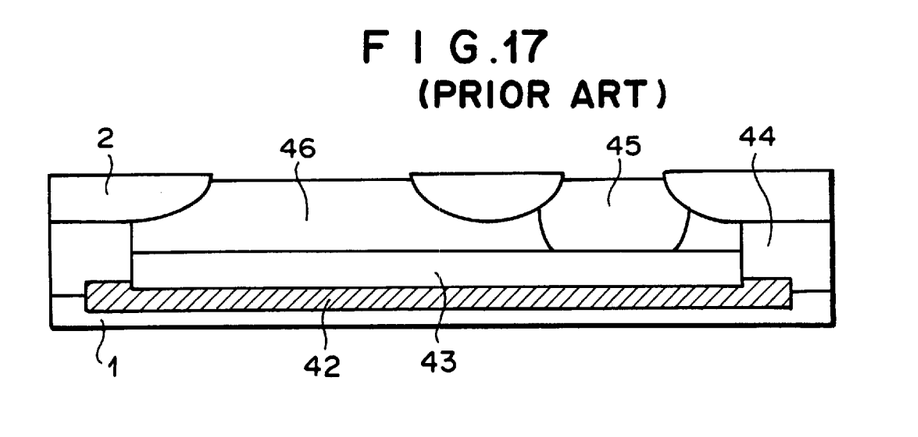
FIG. 17 is another cross-sectional view showing the first conventional semiconductor device manufacturing process.

Subsequently, as shown in FIG. 17, a field oxide film 2 is selectively formed by LOCOS method to fix a transistor region, and then the substrate surface is oxidized to form an oxide film having a thickness of 20 to 30 nm. Thereafter, P-type impurities are doped from the substrate surface by an ion implantation method using a photoresist (not shown) as a mask, and then a heat treatment is carried out to form a collector drawing region 45. Thereafter, a P-type collector region 46 having a low impurity concentration is formed on the high-concentration P-type impurity region 43.

Figure 18:
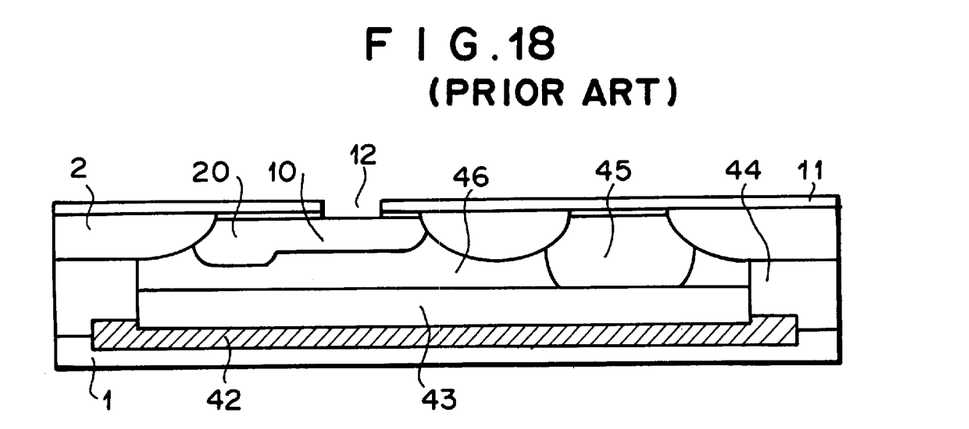
FIG. 18 is another cross-sectional view showing the first conventional semiconductor device manufacturing process.

Subsequently, as shown in FIG. 18, an N-type intrinsic base region 10 and an external base region 20 are formed, and then an emitter contact 12 is formed in an oxide film 11 which is grown on the overall surface.

Figure 19:
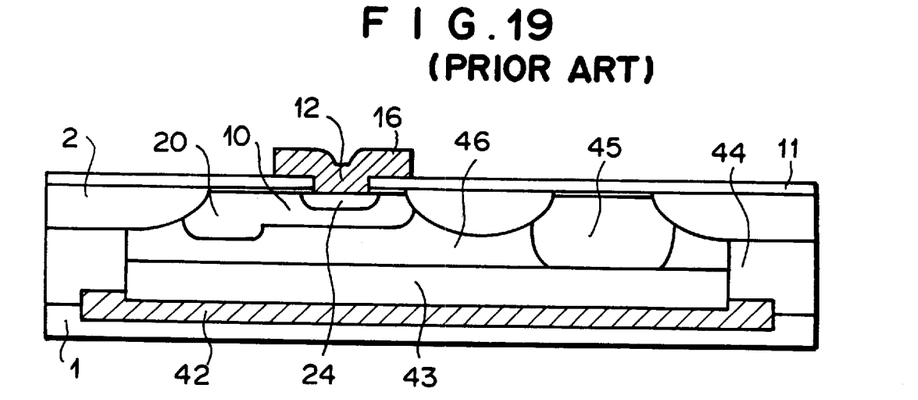
FIG. 19 is another cross-sectional view showing the first conventional semiconductor device manufacturing process.

Subsequently, as shown in FIG. 19, boron is doped into a polycrystalline silicon layer grown on the overall surface, and the polycrystalline silicon layer is subjected to a patterning treatment by using a photoresist as a mask (not shown) to form an emitter electrode 16. Thereafter, the heat treatment is carried out to diffuse boron from the polycrystalline silicon layer of the emitter electrode 16 to the silicon substrate, thereby forming a P-type emitter region 24.

Figure 20:
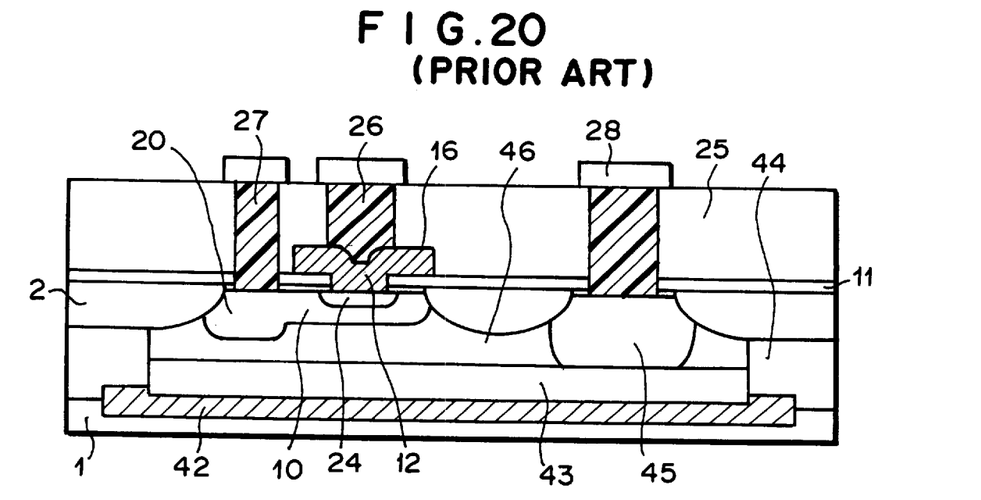
FIG. 20 is another cross-sectional view showing the first conventional semiconductor device manufacturing process.

Thereafter, as shown in FIG. 20, an interlayer insulating film 25 is formed on the overall surface, tungsten is buried into a contact 26 formed in the interlayer insulating film 25 and then an aluminum wiring 28 is formed, thereby forming V-PNP.

In the manufacturing method described above, an N-type buried layer 42 and an N-type epitaxial layer 44 must be formed to separate the P-type collector region 46 from the P-type substrate 1, and thus the number of manufacturing steps is large. As a method of reducing the number of manufacturing steps has been proposed a manufacturing method shown in FIGS. 21 to 24 (second conventional method).

Figure 21:
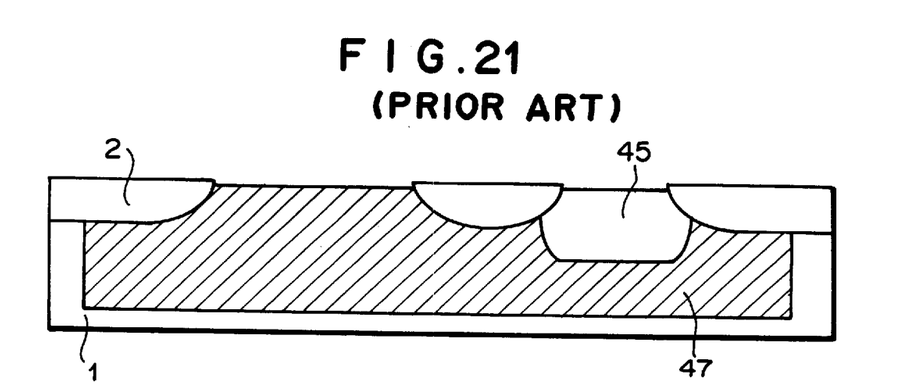
FIG. 21 is a cross-sectional view showing a second conventional semiconductor device manufacturing process.

According to the second conventional method, as shown in FIG. 21, a field oxide film 2 is formed on a P-type silicon substrate 1, p-type impurities are doped from the substrate surface by ion implantation and then the heat treatment is carried out to diffuse impurities, thereby forming a P-type collector drawing region 45 having a high impurity concentration. Thereafter, an N-type impurity region 47 is formed.

Figure 22:
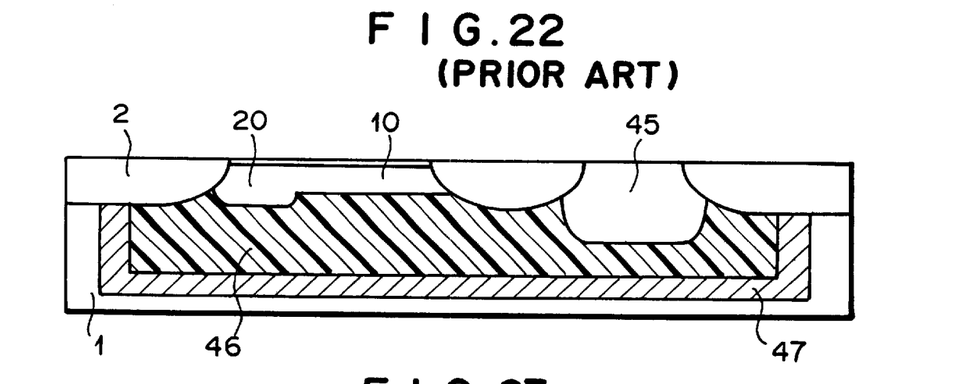
FIG. 22 is another cross-sectional view showing the second conventional semiconductor device manufacturing process.

Subsequently, as shown in FIG. 22, P-type impurities and N-type impurities are doped into the inside of the N-type impurity region 47 by ion implantation in the same mask step to form a P-type collector region 46 and an N-type base region 10. The N-type impurity region 47 is provided to separate the P-type collector region 46 and the P-type substrate from each other. Thereafter, an external base region 20 is formed.

Figure 23:
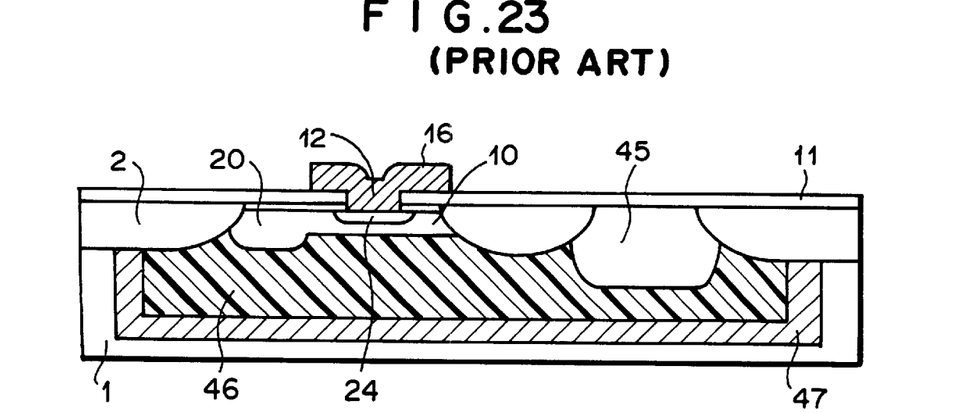
FIG. 23 is another cross-sectional view showing the second conventional semiconductor device manufacturing process.

Subsequently, as shown in FIG. 23, an emitter contact 12 is formed in an oxide film 11 grown on the overall surface, and then boron is ion-implanted into a polycrystalline silicon layer grown on the overall surface. Thereafter, the patterning treatment is carried out to form an emitter electrode 16. Thereafter, the heat treatment is carried out to diffuse boron from the polycrystalline silicon layer of the emitter electrode 16 to the silicon substrate 1, thereby forming a P-type emitter region 24.

Figure 24:
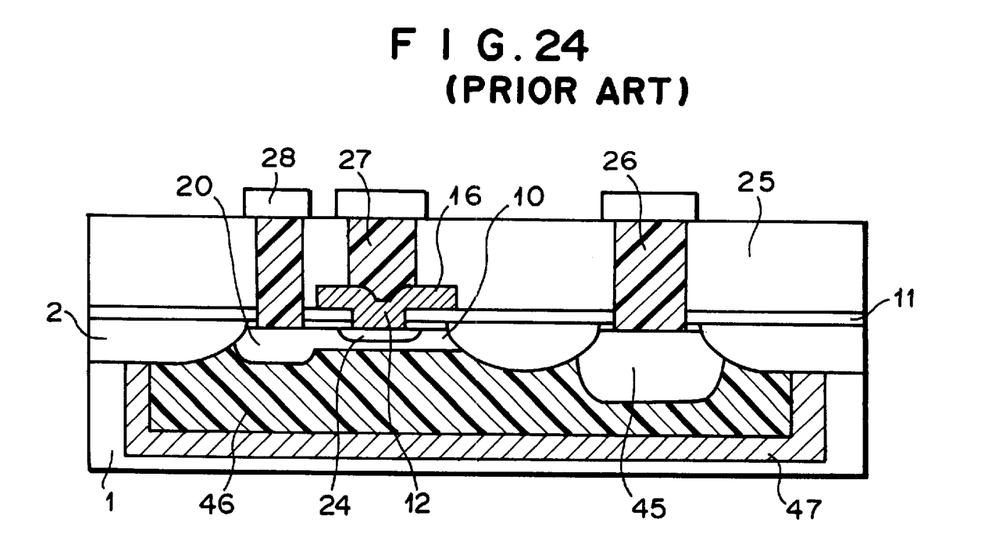
FIG. 24 is another cross-sectional view showing the second conventional semiconductor device manufacturing process.

Subsequently, as shown in FIG. 24, an interlayer insulating film 25 is formed on the overall surface, tungsten is buried into a contact 26 formed in the interlayer insulating film 25, and then an aluminum wiring 28 is formed, thereby forming V-PNP.

In the above-described second conventional method, the P-type collector region 46 and the N-type impurity region 47 used for element isolation are formed in different mask steps. These steps cannot be commonly used with a step of forming CMOS or vertical type NPN bipolar transistor, and thus when CMOS transistor or V-NPN and V-PNP are formed on the same substrate, the number of manufacturing steps and the number of mask steps are increased.

The above is applied to an inverse conduction type case (that is, P is substituted by N and N is substituted by P).

SUMMARY OF THE INVENTION

Therefore, an object of the present invention is to provide a semiconductor device manufacturing method which can form V-PNP or V-NPN with a small number of steps and a small number of masks.

Another object of the present invention is to provide a semiconductor device manufacturing method which can commonly use (i.e., simultaneously carry out) a part of a step of forming V-PNP or V-NPN with a step of forming the other elements when the other elements such as transistors, etc are formed on the same substrate together with V-PNP or V-NPN.

In order to attain the above object, according to a first aspect of the present invention, a method of manufacturing a semiconductor device having a vertical PNP bipolar transistor formed on a P-type semiconductor substrate, is characterized in that a step of forming an N-type bottom separation region on the P-type semiconductor substrate to separate or isolate the vertical PNP bipolar transistor, a step of forming a P-type collector region of the vertical PNP bipolar transistor, and a step of forming an N-type base region of the vertical PNP bipolar transistor are performed by using the same mask.

In the above method, the formation of the N-type bottom separation region, the formation of the P-type collector region and the formation of the N-type base region my be performed by using impurity-ion implantation.

In the above method, prior to the step of forming the N-type bottom separation region, an N-type side separation region may be formed in the P-type semiconductor substrate to separate or isolate the vertical PNP bipolar transistor, and the N-type bottom separation region, the P-type collector region and the N-type base region may be formed within an area which is separated by the N-type side separation region.

In the above method, an N-type side separation region may be formed in the P-type semiconductor substrate to separate or isolate the vertical PNP bipolar transistor after the N-type bottom separation region, the P-type collector region and the N-type base region are formed.

In the above method, the formation of the N-type side separation region may be performed by using impurity-ion implantation.

Further, in order to attain the above object, according to a second aspect of the present invention, a method of manufacturing a semiconductor device having a vertical PNP bipolar transistor and the other element which are formed on a P-type semiconductor substrate, is characterized in that simultaneously with an N-type impurity region forming step when the other element is formed on the P-type semiconductor substrate, N-type impurities are doped into a desired region of the P-type semiconductor substrate to form an N-type side separation region for separation or isolation of the vertical PNP bipolar transistor.

In the above method, the formation of the N-type impurity region and the formation of the N-type side separation region may be performed by using impurity ion implantation.

In the above method, the other element may be a vertical NPN bipolar transistor, and the N-type impurity region forming step may be an N-type collector region forming step.

In the above method, the other element may be a PMOS transistor, and the N-type impurity region forming step may be a step of forming N-well for PMOS transistor.

According to a third aspect of the present invention, a method of manufacturing a semiconductor device having a vertical PNP bipolar transistor and a vertical NPN bipolar transistor formed on a P-type semiconductor substrate comprises the steps of:

forming a first trench extending to a P-type collector region of the vertical PNP bipolar transistor and a second trench extending to an N-type collector region of the vertical NPN bipolar transistor;

doping N-type impurities through the second trench simultaneously with a step of forming an N-type external base region of the vertical PNP bipolar transistor to form an N-type collector drawing region of the vertical NPN bipolar transistor; and doping P-type impurities through the first trench simultaneously with a step of forming a P-type external base region of the vertical NPN bipolar transistor to form a P-type collector drawing region of the vertical PNP bipolar transistor.

In the above method, the formation of the N-type external base region, the formation of the N-type collector drawing region, the formation of the P-type external base region and the formation of the P-type collector drawing region may be performed by using impurity ion implantation.

In the above method, the formation of the first trench and the second trench may be performed by an over-etching treatment which is conducted when an emitter electrode of the vertical PNP bipolar transistor and an emitter electrode of the vertical NPN bipolar transistor are formed by a patterning treatment.

In the above method, simultaneously with an N-type collector region forming step when the vertical NPN bipolar transistor is formed on the P-type semiconductor substrate, N-type impurities may be doped into a desired region of the P-type semiconductor substrate to form an N-type side separation region for separation or isolation of the vertical PNP bipolar transistor.

In the above method, the formation of the N-type side separation region may be carried out by impurity ion implantation.

In the above method, in an area separated by the N-type side separation region of the P-type semiconductor substrate, a step of forming an N-type bottom separation region for separating the vertical PNP bipolar transistor, a step of forming a P-type collector region of the vertical PNP bipolar transistor, and a step of forming an N-type base region of the vertical PNP bipolar transistor may be performed by using the same mask.

In the above method, the P-type semiconductor substrate may be a P-type silicon substrate.

According to a fourth aspect of the present invention, a method of manufacturing a semiconductor device having a vertical NPN bipolar transistor formed on an N-type semiconductor substrate, is characterized in that a step of forming on the N-type semiconductor substrate a P-type bottom separation region for separating or isolating the vertical NPN bipolar transistor, a step of forming an N-type collector region of the vertical NPN bipolar transistor, and a step of forming a P-type base region of the vertical NPN bipolar transistor, are performed by using the same mask.

In the above method, the formation of the P-type bottom separation region, the formation of the N-type collector region and the formation of the P-type base region may be performed by using impurity ion implantation.

In the above method, prior to the step of forming the P-type bottom separation region, a P-type side separation region for separating or isolating the vertical NPN bipolar transistor may be formed on the N-type semiconductor substrate, and the P-type bottom separation region, the N-type collector region and the P-type base region may be formed in an area which is separated or isolated by the P-type side separation region.

In the above method, a P-type side separation region may be formed in the N-type semiconductor substrate to separate or isolate the vertical NPN bipolar transistor after the P-type bottom separation region, the N-type collector region and the P-type base region are formed.

In the above method, the formation of the P-type side separation region may be performed by using impurity ion implantation.

According to a fifth aspect of the present invention, a method of manufacturing a semiconductor device having a vertical NPN bipolar transistor and the other element formed on an N-type semiconductor substrate, is characterized in that simultaneously with a step of forming a P-type impurity region when the other element is formed on the N-type semiconductor substrate, P-type impurities are doped into a desired region of the N-type semiconductor substrate to form a P-type side separation region for separating or isolating the vertical NPN bipolar transistor.

In the above method, the formation of the P-type impurity region and the formation of the P-type side separation region may be performed by using impurity ion implantation.

In the above method, the other element may be a vertical PNP bipolar transistor, and the P-type impurity region forming step may be a P-type collector region forming step.

In the above method, the other element may be an NMOS transistor, and the P-type impurity region forming step is a step of forming P-well for NMOS transistor.

According to a sixth aspect of the present invention, a method of manufacturing a semiconductor device having a vertical NPN bipolar transistor and a vertical PNP bipolar transistor formed on an N-type semiconductor substrate, comprises the steps of:

forming a first trench extending to an N-type collector region of the vertical NPN bipolar transistor and a second trench extending to a P-type collector region of the vertical PNP bipolar transistor;

doping P-type impurities through the second trench simultaneously with a step of forming a P-type external base region of the vertical NPN bipolar transistor to form a P-type collector drawing region of the vertical PNP bipolar transistor; and doping N-type impurities through the first trench simultaneously with a step of forming a N-type external base region of the vertical PNP bipolar transistor to form an N-type collector drawing region of the vertical NPN bipolar transistor.

In the above method, the formation of the P-type external base region, the formation of the P-type collector drawing region, the formation of the N-type external base region and the formation of the N-type collector drawing region may be performed by using impurity ion implantation.

In the above method, the formation of the first trench and the second trench may be performed by an over-etching treatment which is conducted when an emitter electrode of the vertical NPN bipolar transistor and an emitter electrode of the vertical PNP bipolar transistor are formed by a patterning treatment.

In the above method, simultaneously with a P-type collector region forming step when the vertical PNP bipolar transistor is formed on the N-type semiconductor substrate, P-type impurities may be doped into a desired region of the N-type semiconductor substrate to form a P-type side separation region for separation or isolation of the vertical N-type NPN bipolar transistor.

In the above method, the formation of the P-type side separation region may be carried out by impurity ion implantation.

In the above method, a step of forming a P-type bottom separation region for separating or isolating the vertical NPN bipolar transistor, a step of forming an N-type collector region of the vertical NPN bipolar transistor, and a step of forming a P-type base region of the vertical NPN bipolar transistor may be performed by using the same mask in an area separated by the P-type side separation region of the N-type semiconductor substrate.

In the above method, the N-type semiconductor substrate may be an N-type silicon substrate.

According to the present invention, in the method of manufacturing a semiconductor device having the vertical PNP bipolar transistor or the vertical NPN bipolar transistor, the N-type impurities and the P-type impurities are doped in the same mask step by the ion implantation to form the bottom separation region, the collector region and the base region. Therefore, the manufacturing step number and the mask number can be reduced, and the manufacturing cost can be reduced.

Further, according to the present invention, when, in addition to the vertical PNP bipolar transistor or the vertical NPN bipolar transistor, another element (for example, a vertical NPN bipolar transistor, a vertical PNP bipolar transistor, a PMOS transistor or NMOS transistor) is formed on the semiconductor substrate, the element separation region at the side portion of the collector of the vertical bipolar transistor is formed in the same step of the formation of the impurity region (for example, the formation of the collector region of the vertical bipolar transistor or the formation of the N-well or P-well for the PMOS or NMOS transistor) when the other element is formed. Therefore, the special-purpose step of forming the vertical bipolar transistor and the number of steps can be reduced, and the manufacturing cost can be reduced.

Further, according to the present invention, when the vertical PNP bipolar transistor and the vertical NPN bipolar transistor are formed on the semiconductor substrate, the trench is formed in the collector region simultaneously with, for example, the formation of the emitter electrode of the vertical bipolar transistor, and the collector drawing region of each vertical bipolar transistor is formed there simultaneously with the formation of the external base region of the other vertical bipolar transistor. Therefore, the manufacturing step number and the mask number can be reduced, and thus the manufacturing cost can be reduced.

DETAILED DESCRIPTION OF THE PREFERRED EMBODIMENTS

Preferred embodiments according to the present invention will be described hereunder with reference to the accompanying drawings.

A first embodiment of a semiconductor device manufacturing method according to the present invention will be described with reference to FIGS. 1 to 6 which show a series of manufacturing steps. In this embodiment, V-PNP and V-NPN are formed on the same substrate.

Figure 1:
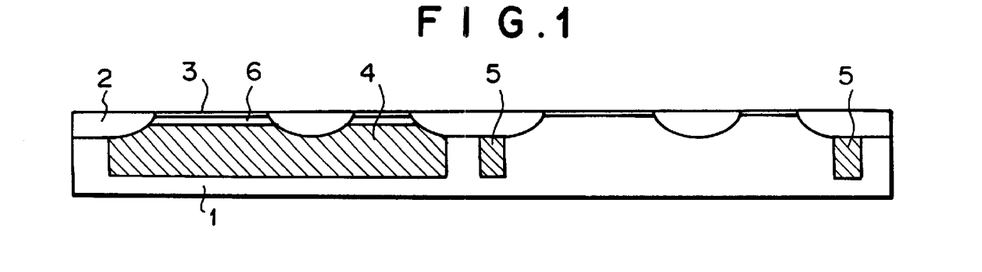
FIG. 1 is a cross-sectional view showing a manufacturing process of a first embodiment of a semiconductor device manufacturing method according to the present invention.

First, as shown in FIG. 1, a field oxide film 2 is selectively formed on a P-type silicon substrate 1 by using LOCOS method, and then the substrate surface is oxidized to form an oxide film 3 of 20 to 30 nm in thickness. Thereafter, phosphor is doped under energy of 1 to 2 MeV and at a dose amount of 2 to 4E13 $cm^{-2}$ by ion implantation to form a collector region 4 of V-NPN and an N-type side separation region 5 of V-PNP at the same time. Further, $BF_2$ is doped under energy of 10 to 20 KeV and at a dose amount of 1 to 5E13 $cm^{-2}$ by ion implantation to form a P-type base region 6 of V-NPN.

Figure 2:
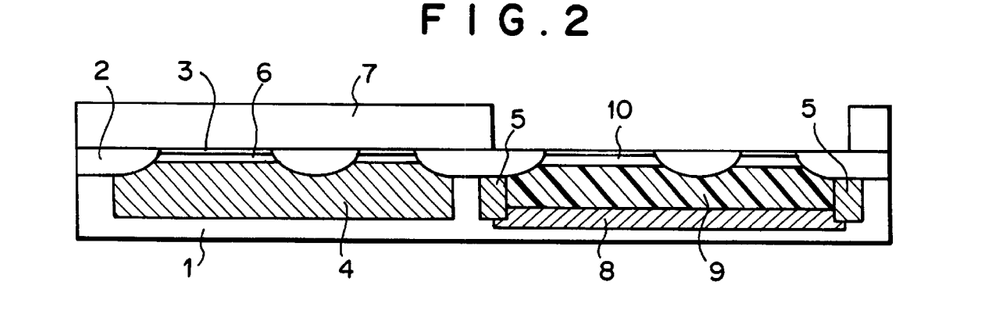
FIG. 2 is another cross-sectional view showing the manufacturing process of the first embodiment of the semiconductor device manufacturing method according to the present invention.

Next, as shown in FIG. 2, phosphor and boron are doped into the area surrounded by N-type side separation region 5 with photoresist 7 as a mask by ion implantation to form an N-type bottom separation region 8 of V-PNP, a P-type collector region 9 and an N-type base region 10. The ion implantation conditions to form these regions are as follows. That is, phosphor is doped under energy of 1 to 2 MeV and at a dose amount of 2 to 4E13 $cm^{-2}$ in order to form the N-type bottom separation region 8, boron is doped under energy of 1 to 2 MeV and at a dose amount of 2 to 4E13 $cm^{-2}$ in order to form the P-type collector region 9, and phosphor is doped under energy of 100 to 150 KeV and at a dose amount of 2 to 4E13 $cm^{-2}$ in order to form the N-type base region 10.

The collector region 4 of V-NPN and the N-type side separation region 5 may be formed after the N-type bottom separation region 8, the P-type collector region 9 and the N-type base region 10 are formed.

Figure 3:
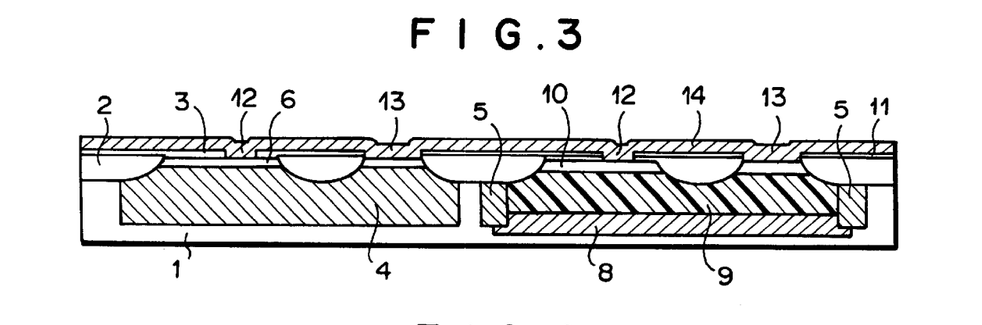
FIG. 3 is another cross-sectional view showing the manufacturing process of the first embodiment of the semiconductor device manufacturing method according to the present invention.

Subsequently, after the photoresist 7 is removed, an emitter contact 12 and a collector contact 13 which extend to the substrate surface are formed in an oxide film 11 of 50 to 100 nm in thickness grown on the overall surface as shown in FIG. 3. Thereafter, a polycrystalline silicon layer 14 of 200 to 300 nm in thickness is grown on the overall surface containing the emitter contact 12 and the collector contact 13.

Figure 4:
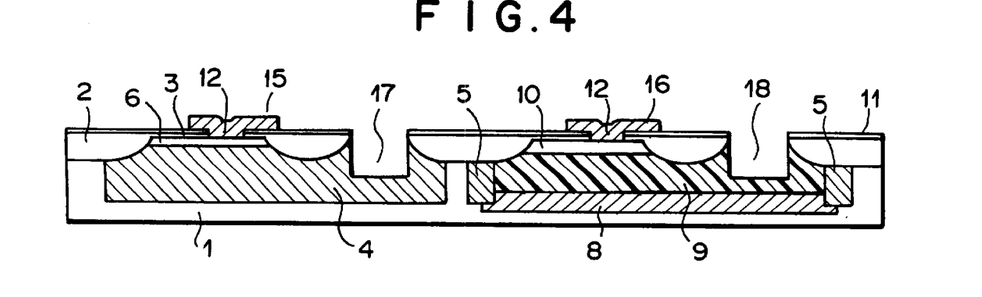
FIG. 4 is another cross-sectional view showing the manufacturing process of the first embodiment of the semiconductor device manufacturing method according to the present invention.

Subsequently, as shown in FIG. 4, the polycrystalline silicon layer 14 is subjected to a patterning treatment so that it remains only in the neighborhood of the emitter contact 12, thereby forming emitter electrodes 15 and 16. At this time, an over-etching treatment is carried out on the polycrystalline silicon layer, and the substrate portion corresponding to the collector contact 13 is etched to form trenches 17 and 18 at a depth of about 1.0 $\mu$m.

Figure 5:
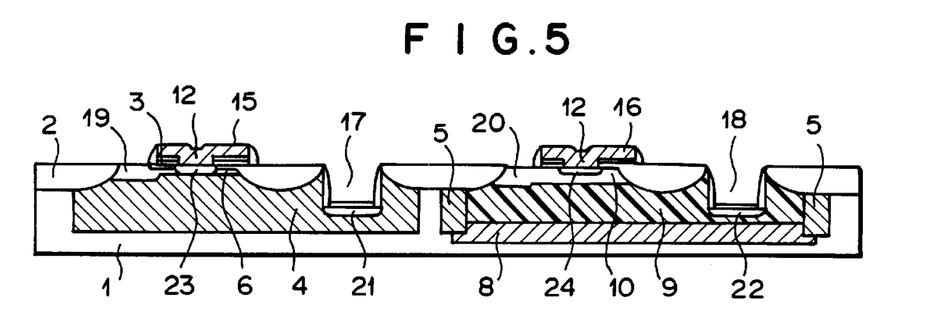
FIG. 5 is another cross-sectional view showing the manufacturing process of the first embodiment of the semiconductor device manufacturing method according to the present invention.

Subsequently, as shown in FIG. 5, after the oxide film is grown on the overall surface, an anisotropic etching treatment is carried out to form side walls on the side surfaces of the emitter electrodes 15 and 16. Thereafter, boron or $BF_2$ are ion-implanted at a dose amount of 5E15 to 1E16 $cm^{-2}$ so that a P-type external base region 19 of V-NPN and a P-type collector drawing region 22 of V-PNP are formed, and doped into the emitter electrode 16 of V-PNP. Phosphor or arsenic is doped at a dose amount of 5E15 to 1E16 $cm^{-2}$ into the emitter electrode 15 of V-NPN, and doped so that the N-type collector drawing region 21 of V-NPN and the N-type external base region 20 of V-PNP are formed. Thereafter, under a nitrogen atmosphere, the heat treatment is performed at a temperature of about 1000° C. to activate and diffuse impurities. At this time, the N-type impurities are diffused from the emitter electrode 15 of V-NPN into the substrate to form an N-type emitter region 23. Likewise, the P-type impurities are diffused from the emitter electrode 16 of V-PNP into the substrate to form a P-type emitter region 24.

Figure 6:
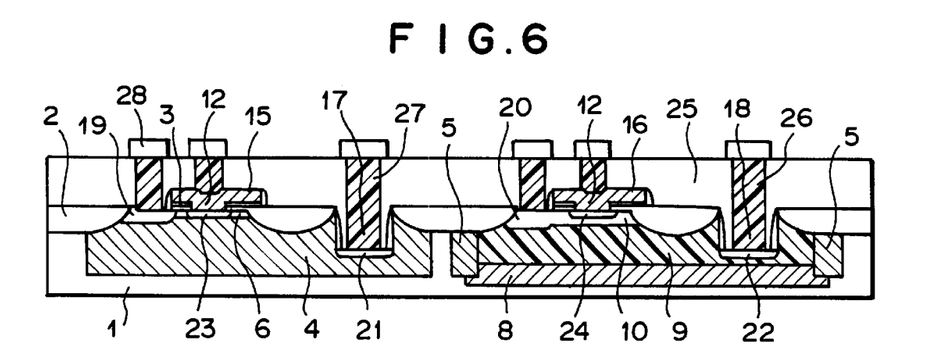
FIG. 6 is another cross-sectional view showing the manufacturing process of the first embodiment of the semiconductor device manufacturing method according to the present invention.

Thereafter, as shown in FIG. 6, an interlayer insulating film 25 is formed on the overall surface, and tungsten 27 is buried into a contact 26 formed in the interlayer insulating film 25. Thereafter, an aluminum wiring 28 is formed, thereby obtaining a semiconductor device in which V-NPN and V-PNP are formed on the same P-type substrate.

In the above embodiment, as shown in FIGS. 1 and 2, the N-type side separation region 5 of V-PNP is formed simultaneously with the N-type collector region 4 of V-NPN. Thereafter, in the same mask step, the N-type bottom separation region 8 of V-PNP, the P-type collector region 9 and the N-type base region 10 are formed to separate the P-type collector region 9 from the P-type substrate 1 by the N-type side separation region 5 and the N-type bottom separation region 8. According to this manufacturing method, the N-type bottom separation region 8 and the P-type collector region 9 which has been hitherto formed in different mask steps in the prior art can be formed at the same time in the same mask step together with the N-type base region 10. Further, as shown in FIGS. 4 and 5, the trenches 17 and 18 are formed at the collector portion simultaneously with the formation of the emitter electrodes 15, 16 of V-NPN and V-PNP, and the collector drawing regions 21 and 22 are formed there simultaneously with the formation of the external base regions 20, 19, respectively, so that the number of mask steps can be reduced. That is, V-PNP can be formed by merely adding only one mask step to the process of forming V-NPN.

Next, a second embodiment of a semiconductor device manufacturing method will be described with reference to FIGS. 7 to 13 which are cross-sectional views of a series of manufacturing steps. In this embodiment, V-PNP and V-NPN are formed on the same substrate, and PMOS and NMOS are also formed on the same substrate.

Figure 7:
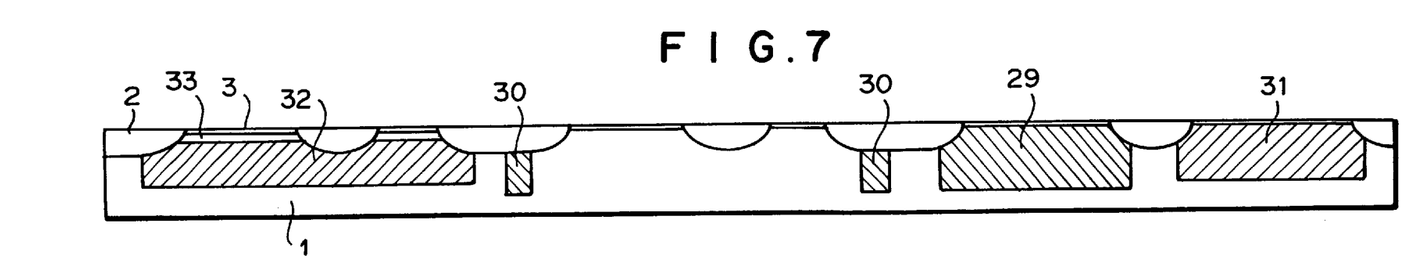
FIG. 7 is a cross-sectional view showing a manufacturing process of a second embodiment of the semiconductor device manufacturing method according to the present invention.

First, as shown in FIG. 7, a field oxide film 2 is selectively formed on a P-type silicon substrate 1 by the LOCOS method, and then the substrate surface is oxidized to form an oxide film 3 of 20 to 30 nm in thickness. Thereafter, phosphor is doped by ion implantation to form an N-well 29 for PMOS and an N-type side separation region 30 in a region of V-PNP. At this time, the ion implantation operation of phosphor is performed three times under the following conditions. That is, the first operation is carried out under the condition of energy of 500 KeV to 1 MeV and dose amount of 2 to 4E13 $cm^{-2}$, the second operation is carried out under the condition of energy of 200 to 300 KeV and dose amount of 2 to $4E12^{-2}$, and the third operation is carried out under the condition of energy of 50 to 100 KeV and dose amount of 2 to 4E12 $cm^{-2}$. Subsequently, boron is ion-implanted under the condition of energy of 300 to 500 KeV and dose amount of 2 to 4E13 $cm^{-2}$, under the condition of energy of 100 to 200 KeV and dose amount of 2 to 4E12 $cm^{-2}$, and under the condition of energy of 20 to 40 KeV and dose amount of 2 to 4E12 $cm^{-2}$ to form a P-well 31. Subsequently, phosphor is doped under the condition: energy of 500 KeV to 1 MeV and dose amount of 5 to 10E13 $cm^{-2}$ by ion implantation, and $BF_2$ is doped under the condition: energy of 10 to 20 KeV and dose amount of 1 to 5E13 $cm^{-2}$ by ion implantation to form an N-type collector region 32 of V-NPN and a P-type base region 33.

Figure 8:
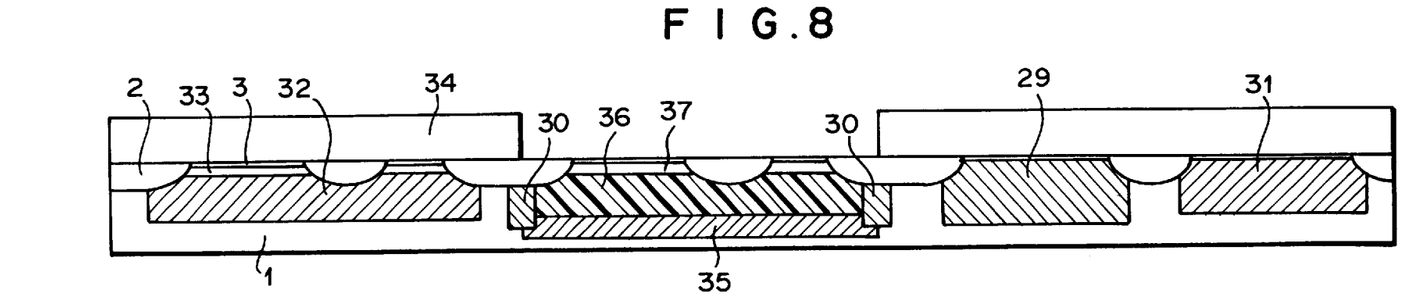
FIG. 8 is another cross-sectional view showing the manufacturing process of the second embodiment of the semiconductor device manufacturing method according to the present invention.

Subsequently, as shown in FIG. 8, phosphor and boron are implanted into an area surrounded by the N-type side separation region 30 by using photoresist 34 as a mask to form an N-type bottom separation region 35, a P-type collector region 36 and an N-type base region 37 of V-PNP. The ion implantation conditions to form these regions are as follows. That is, phosphor is doped under energy of 1 to 2 MeV and at a dose of 2 to 4E13 $cm^{-2}$ in order to form the N-type bottom separation region 35, boron is doped under energy of 1 to 2 MeV and at a dose amount of 2 to 4E13 $cm^{-2}$ in order to form the P-type collector region 36, and phosphor is doped under energy of 100 to 150 KeV and at a dose amount of 2 to 4E13 $cm^{-2}$ in order to form the N-type base region 37.

The N-well 29 for PMOS and the N-type side separation region 30 may be formed after the N-type bottom separation region 35, the P-type collector region 36 and the N-type base region 37 are formed.

Figure 9:
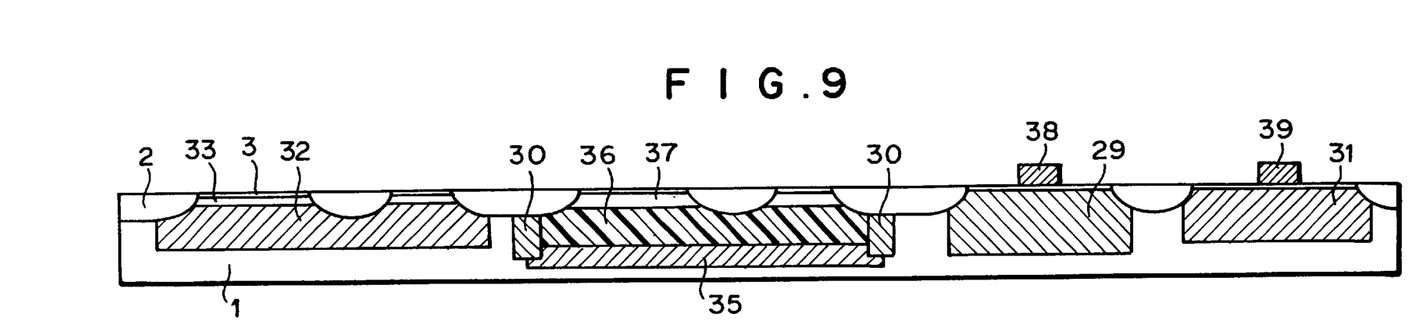
FIG. 9 is another cross-sectional view showing the manufacturing process of the second embodiment of the semiconductor device manufacturing method according to the present invention.

Subsequently, after the photoresist 34 is removed, as shown in FIG. 9, a polycrystalline silicon layer which is grown at a thickness of 150 to 200 nm on the overall surface is subjected to a patterning treatment to form gate electrodes 38, 39 of PMOS and NMOS for CMOS.

Figure 10:
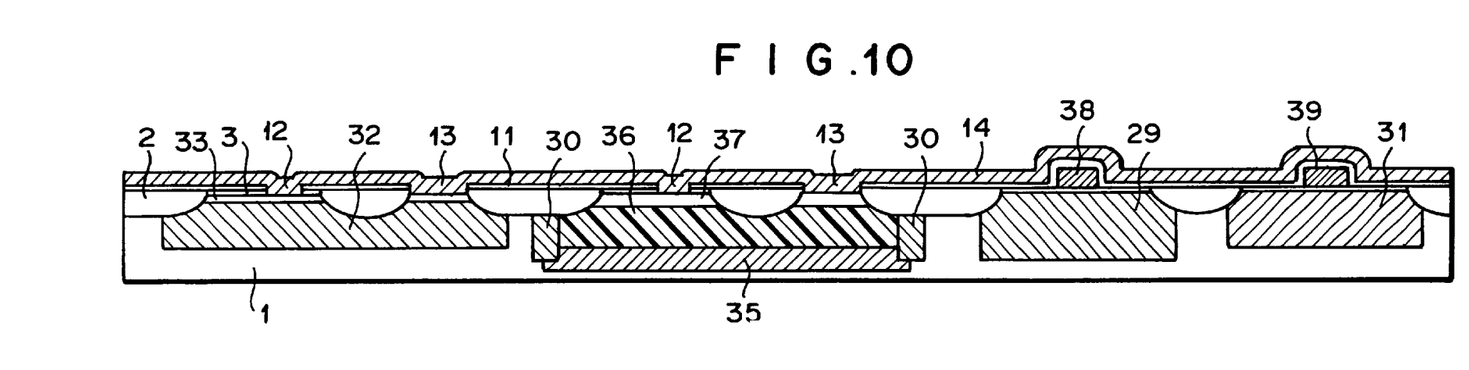
FIG. 10 is another cross-sectional view showing the manufacturing process of the second embodiment of the semiconductor device manufacturing method according to the present invention.

Subsequently, as shown in FIG. 10, an emitter contact 12 and a collector contact 13 extending to the substrate surface are formed at the same time in the oxide film 11 grown on the overall surface. Thereafter, a polycrystalline silicon layer 14 is grown at a thickness of 200 to 300 nm on the overall surface containing the emitter contact 12 and the collector contact 13.

Figure 11:
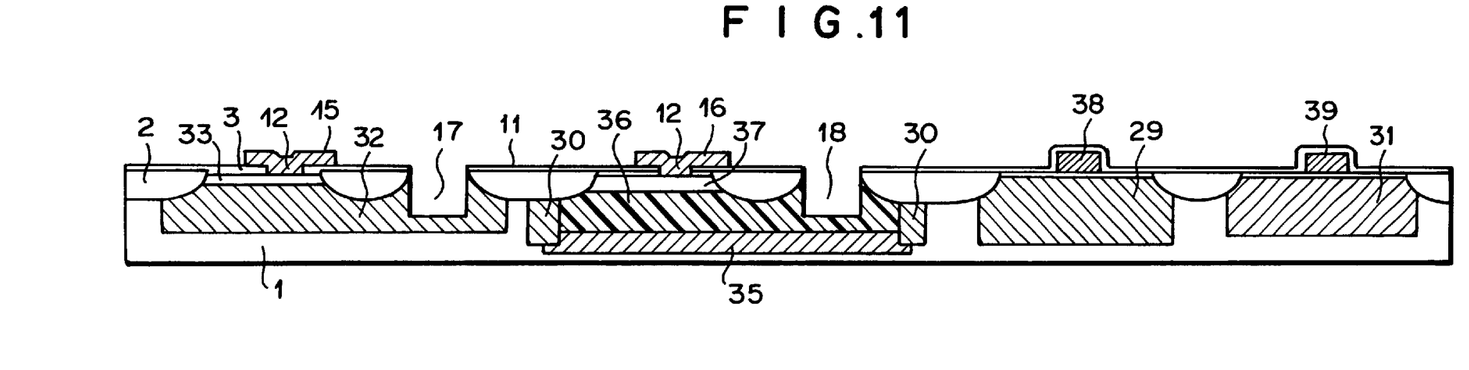
FIG. 11 is another cross-sectional view showing the manufacturing process of the second embodiment of the semiconductor device manufacturing method according to the present invention.

Subsequently, as shown in FIG. 11, the polycrystalline silicon layer 14 is subjected to the patterning treatment so that it remains only in the neighborhood of the emitter contact 12, thereby forming emitter electrodes 15 and 16. At this time, the over-etching treatment is carried out on the polycrystalline silicon layer 14 and the substrate portion corresponding to the collector contact 13 is etched to form trenches 17 and 18 at a depth of about 1.0 $\mu$m.

Figure 12:
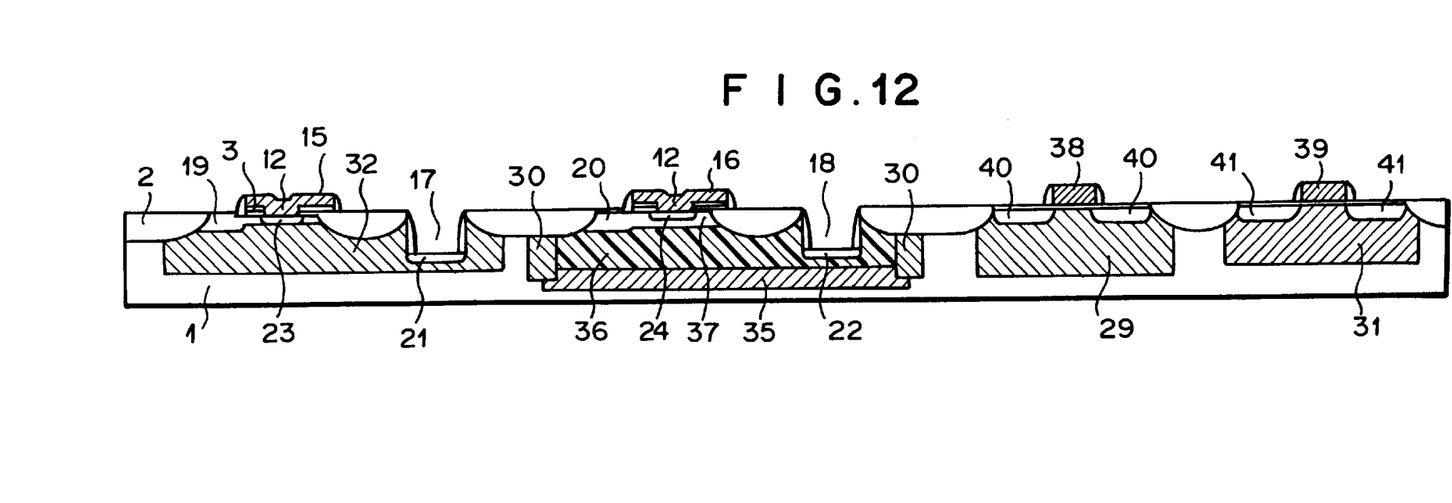
FIG. 12 is another cross-sectional view showing the manufacturing process of the second embodiment of the semiconductor device manufacturing method according to the present invention.

Subsequently, as shown in FIG. 12, an anisotropic etching treatment is carried out on the oxide film grown on the overall surface to form side walls on the side surfaces of the emitter electrodes 15, 16 and the gate electrodes 38, 39. Thereafter, boron or $BF_2$ is doped at a dose amount of 5E15 to 1E16 $cm^{-2}$ so as to form a P-type external base region 19 of V-NPN, a P-type collector drawing region 22 of V-PNP and a P-type source/drain region 40 of PMOS, and also doped into the emitter electrode 16 of V-PNP and the gate electrode 38 of PMOS. Further, phosphor or arsenic is doped at a dose amount of 5E15 to 1E16 $cm^{-2}$ so as to form an N-type collector drawing region 21 of V-NPN, an N-type external base region 20 of V-PNP and an N-type source/drain region 41 of NMOS, and also doped into the emitter electrode 15 of V-NPN and the gate electrode 39 of NMOS. Thereafter, a heat treatment is performed at about 1000° C. under the nitrogen atmosphere to activate and diffuse the impurities. At this time, the N-type impurities are diffused from the emitter electrode 15 of V-NPN into the substrate to form an N-type emitter region 23. Likewise, the P-type impurities are diffused from the emitter electrode 16 of V-PNP into the substrate to form a P-type emitter electrode 24.

Figure 13:
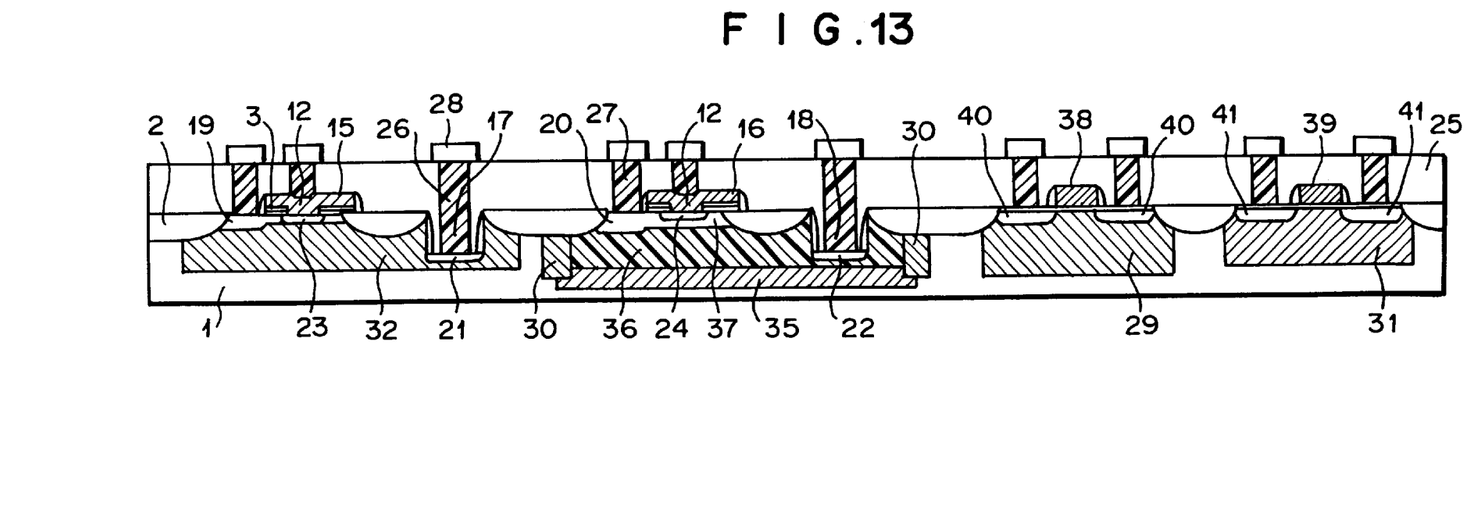
FIG. 13 is another cross-sectional view showing the manufacturing process of the second embodiment of the semiconductor device manufacturing method according to the present invention.

Thereafter, as shown in FIG. 13, an interlayer insulating film 25 is formed on the overall surface, tungsten 27 is buried into a contact 26 formed in the interlayer insulating film 25, and then an aluminum wiring 28 is formed, thereby obtaining a semiconductor device in which V-NPN, V-PNP, PMOS and NMOS are formed on the same P-type substrate.

In the above embodiment, in the step of forming the N-well 29 of PMOS, the N-type side separation region 30 of V-PNP is formed at the same time. The impurity concentration of the N-well 29 is higher than that of the N-type collector region 32 of V-NPN, and thus as compared with the first embodiment, the withstanding voltage can be more greatly enhanced at the P-type collector region interval of 2 $\mu$m or less as shown in FIGS. 14 and 15.

Figure 14:
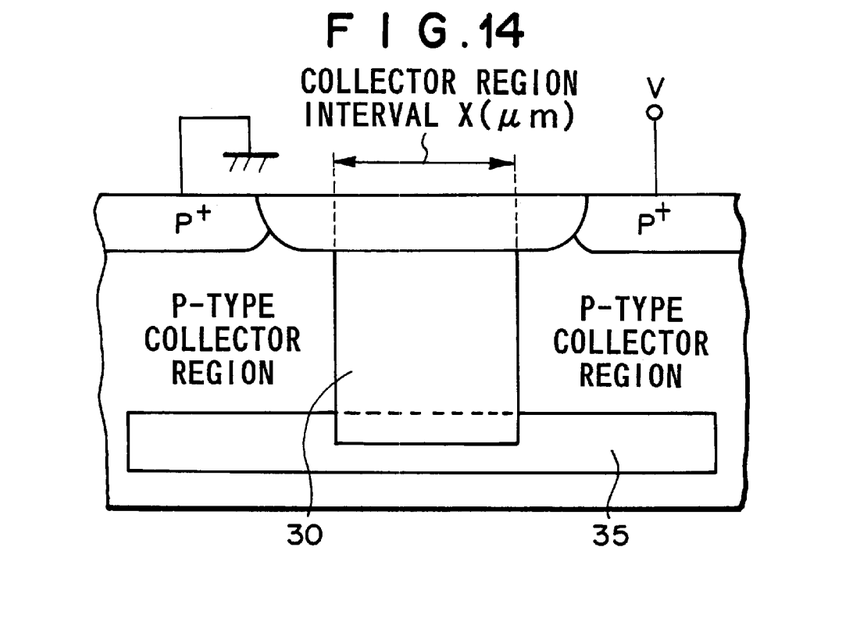
FIG. 14 is a diagram showing an improvement of voltage-withstanding effect of a P-type collector region in the second embodiment of the semiconductor device manufacturing method of the present invention.
Figure 15:
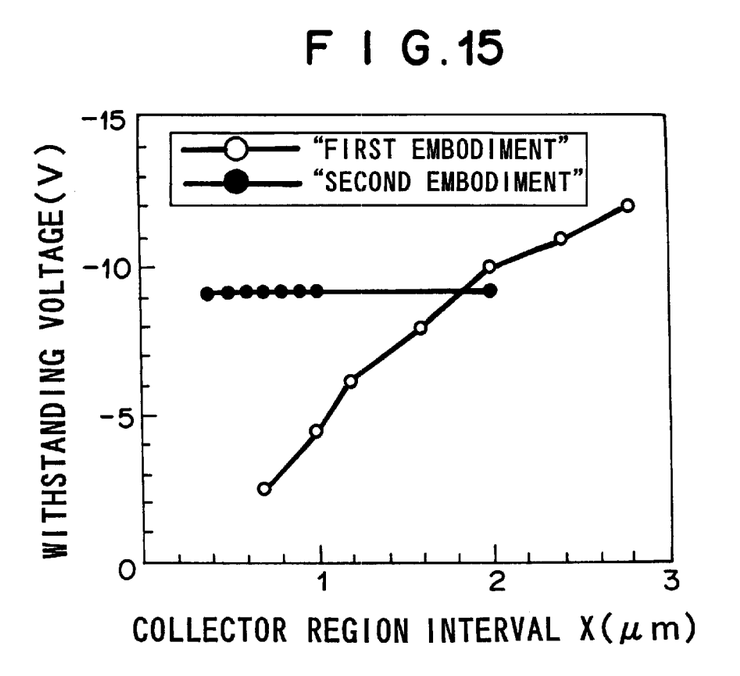
FIG. 15 is a graph showing the improvement of voltage-withstanding effect of the P-type collector region in the second embodiment of the semiconductor device manufacturing method of the present invention.

FIG. 14 shows a state that the P-type collector regions of the adjacent two V-PNPs are disposed at a collector interval X[$\mu$m] by the N-type side separation region 30, and FIG. 15 shows the variation of the withstanding voltage (potential difference V) between the two P-type collector regions when the collector interval X is varied. In FIG. 15, "first embodiment" shows the case of the N-type side separation region 5 obtained in the first embodiment, and "second embodiment" shows the case of the N-type side separation region 30 obtained in the second embodiment. It is apparent from FIG. 15 that the second embodiment is superior to the first embodiment in the collector withstanding voltage at the P-type collector region interval of 2 $\mu$m or less.

In the above-described first and second embodiments, the P-type silicon substrate is used. However, the same effect can be also obtained by using an N-type silicon substrate. In this case, the conduction type may be inverted in the above first and second embodiments (that is, P is substituted by N and N is substituted by P). The semiconductor substrate may be composed of materials other than silicon.

What is claimed is:

1. A method of manufacturing a semiconductor device having a vertical PNP bipolar transistor formed on a P-type semiconductor substrate, characterized in that a step of forming an N-type bottom separation region on the P-type semiconductor substrate to separate the vertical PNP bipolar transistor, a step of forming a P-type collector region of the vertical PNP bipolar transistor, and a step of forming an N-type base region of the vertical PNP bipolar transistor are performed by using the same mask;

wherein the mask has substantially a same thickness during the step of forming bottom separation region, the step of forming the P-type collector region and the step of forming the N-type base region, and the bottom separation region, the P-type collector region and the N-type base regions are created by varying energies used for doping.

2. The method as claimed in claim 1, wherein the formation of the N-type bottom separation region, the formation of the P-type collector region and the formation of the N-type base region are performed by using impurity-ion implantation.

3. The method as claimed in claim 1, wherein prior to the step of forming the N-type bottom separation region, an N-type side separation region is formed in the P-type semiconductor substrate to separate the vertical PNP bipolar transistor, and the N-type bottom separation region, the P-type collector region and the N-type base region are formed within an area which is separated by the N-type side separation region.

4. The method as claimed in claim 3, wherein the formation of the N-type side separation region is performed by using impurity-ion implantation.

5. The method as claimed in claim 1, wherein an N-type side separation region is formed in the P-type semiconductor substrate to separate or isolate the vertical PNP bipolar transistor after the N-type bottom separation region, the P-type collector region and the N-type base region are formed.

6. A method of manufacturing a semiconductor device having a vertical NPN bipolar transistor formed on an N-type semiconductor substrate, characterized in that a step of forming on the N-type semiconductor substrate a P-type bottom separation region for separating the vertical NPN bipolar transistor, a step of forming an N-type collector region of the vertical NPN bipolar transistor, and a step of forming a P-type base region of the vertical NPN bipolar transistor, are performed by using the same mask;

wherein the mask has substantially a same thickness during the step of forming bottom separation region, the step of forming the N-type collector region and the step of forming the P-type base region, and the bottom separation region, the N-type collector region and the P-type base regions are created by varying energies used for doping.

7. The method as claimed in claim 6, wherein the formation of the P-type bottom separation region, the formation of the N-type collector region and the formation of the P-type base region are performed by using impurity ion implantation.

8. The method as claimed in claim 6, wherein prior to the step of forming the P-type bottom separation region, a P-type side separation region for separating the vertical NPN bipolar transistor is formed on the N-type semiconductor substrate, and the P-type bottom separation region, the N-type collector region and the P-type base region are formed in an area which is separated by the P-type side separation region.

9. The method as claimed in claim 8, wherein the formation of the P-type side separation region is performed by using impurity ion implantation.

10. The method as claimed in claim 6, wherein a P-type side separation region is formed in the N-type semiconductor substrate to separate or isolate the vertical NPN bipolar transistor after the P-type bottom separation region, the N-type collector region and the P-type base region are formed.

* * * * *

UNITED STATES PATENT AND TRADEMARK OFFICE
CERTIFICATE OF CORRECTION

PATENT NO.    : 6,337,252 B1
DATED         : January 8, 2002
INVENTOR(S)   : Hiroshi Yoshida It is certified that error appears in the above-identified patent and that said Letters Patent is hereby corrected as shown below:

<u>Title page,</u>
ABSTRACT, line 3, delete "PAP" insert -- PNP --;
Line 3, delete "NON" and insert -- NPN --

Signed and Sealed this

Twenty-third Day of April, 2002

Attest:

Attesting Officer

JAMES E. ROGAN
*Director of the United States Patent and Trademark Office*